United States Patent [19]

Carbrey

[11] 4,039,979
[45] Aug. 2, 1977

[54] REDUCTION OF ALIASING DISTORTION IN SAMPLED SIGNALS

[75] Inventor: Robert Lawrence Carbrey, Boulder, Colo.

[73] Assignee: Bell Telephone Laboratories, Incorporated, Murray Hill, N.J.

[21] Appl. No.: 588,012

[22] Filed: June 18, 1975

[51] Int. Cl.² .................. H03H 7/14; H03H 7/10; H03H 7/28; H03K 17/00
[52] U.S. Cl. .................. 333/70 A; 328/151; 328/165; 328/167
[58] Field of Search .................. 328/151, 167, 165; 333/70 T, 70 A, 70 R; 307/238, 246, 235 B; 324/77 B, 78 D, 78 E

[56] References Cited

U.S. PATENT DOCUMENTS

| | | | |
|---|---|---|---|
| 3,469,213 | 9/1969 | Baker | 333/70 R X |
| 3,514,726 | 5/1970 | Poschenrieder | 333/70 R |
| 3,526,858 | 9/1970 | Heinlein et al. | 333/70 R |
| 3,531,741 | 9/1970 | Langer | 333/70 A |
| 3,537,019 | 10/1970 | Reichard | 328/151 X |
| 3,564,146 | 2/1971 | Poschenrieder | 307/246 X |
| 3,588,531 | 6/1971 | Bjor | 328/151 X |
| 3,588,693 | 6/1971 | Halley | 324/77 B |
| 3,603,898 | 9/1971 | Dawson et al. | 333/70 A |
| 3,623,089 | 11/1971 | Bossert | 328/165 X |
| 3,723,891 | 3/1973 | Whiteley | 324/78 E X |
| 3,729,695 | 4/1973 | Condon | 333/70 A |
| 3,753,169 | 8/1973 | Condon | 333/70 A |

*Primary Examiner*—Alfred E. Smith
*Assistant Examiner*—Marvin Nussbaum
*Attorney, Agent, or Firm*—Charles Scott Phelan

[57] ABSTRACT

A method and apparatus for sampling continuous wave signals to reduce aliasing distortion. The signal is sampled at $n$ times the Nyquist rate, where $n$ is an integer greater than 1; and the $n$ most recently produced sequential samples are combined at the Nyquist rate to produce a sequence of composite samples. This sequence of composite samples exhibits reduced aliasing distortion compared with a conventional sampling or sample-and-hold gate.

16 Claims, 8 Drawing Figures

REDUCTION OF ALIASING DISTORTION IN SAMPLED SIGNALS

BACKGROUND OF THE INVENTION

1. Field of the invention

This invention relates generally to the filtering of electrical signals and, more specifically, to a method and apparatus for the removal of undesirable bands of frequencies from an electrical signal.

2. Description of the Prior Art

In sampled signal systems a continuous wave information signal is repetitively sampled to produce a pulse amplitude modulated (PAM) signal. The spectrum of the PAM signal includes a baseband comprising the spectrum of the original continuous signal and a replica of the baseband signal (sideband) centered about each harmonic of the sampling frequency. The tails of the sidebands tend to extend into the baseband and add to its energy, resulting in aliasing distortion of the baseband signal. This aliasing distortion will be present when the baseband signal is subsequently recovered.

Inasmuch as the aliasing distortion results from the sampling process, the only way of curing this distortion is to prevent its occurring in the first place. The common approach to this is to filter the continuous signal in order to band-limit it to frequencies below the highest frequency of interest, and then to sample the resulting band-limited signal at a frequency (the Nyguist rate) in excess of twice this highest frequency of interest.

A lowpass filter employed as described above must not significantly attenuate wanted frequencies. However, above the highest frequency of interest, it should provide as high an attenuation as possible in order to reduce aliasing as much as possible. Unfortunately, conventional filters which provide steep attenuation (roll-off) with frequency tend to be expensive and bulky. Furthermore, the frequency characteristics of such filters tend to be very sensitive to values of reactive components and changes in value which vary with environmental conditions and age.

It is therefore an object of this invention to reduce the aliasing distortion encountered in sampling a continuous wave signal without employing lowpass conventional filters to shape the signal prior to sampling.

The class of N-path type filters known to the art performs bandpass and band re-jection filtering using sampling techniques. Bandass filters of this variety tend to have a gradual roll-off compared with handwidth and, therefore, would not be useful in the present application. The band-rejection type filters can be made to exhibit substantially steeper roll-off. In this type of filter samples of the signal to be filtered are commuted among a plurality of power transmission paths, each including a capacitor in series with a signal source. The typical filter characteristic obtained has transmission notches at every harmonic of the commuting frequency and at DC. If the commuting frequency is made to correspond with the sampling frequency of the system, aliasing reduction could be achieved. The most obvious problem with this filter is the notch at DC which results in the loss of low-frequency components when the signal is reconstructed. This has an adverse effect on noise immunity and envelope delay.

Another problem with these filters is that the transmission is flat except at the notches. So if the input signal contains any components just above the sampling frequency, these will produce aliasing distortion. The third problem is that the roll-off of the filter characteristic is dependent on the actual values of capacitors used and, therefore, will exhibit variation with environment and age. It is, therefore, another object of this invention to perform sharp lowpass filtering of a signal in such a manner that the roll-off frequency characteristic will be insensitive to the values of component capacitors.

Yet another object of this invention is to perform lowpass filtering with sharp roll-off in a manner that facilitates manufacture by high density integrated circuit techniques.

SUMMARY OF THE INVENTION

According to the invention, a continuous-wave signal in which the highest frequency of interest does not exceed $f/2$ is sampled at an integar multiple $n$ of $f$, and the $n$ most recently produced samples are added $f$ times per second (i.e., each time a group of $n$ new samples has been produced) to produce a sum sample. The resulting sequence of sum samples corresponds to the singal normally produced by a sample-and-hold gate, but exhibits substantially less aliasing distortion.

It is a feature of this invention that the sampled pulses of the system are directly produced through the addition of samples generated at a much higher frequency.

It is a feature of a first embodiment of this invention that each of n samples taken at the higher-frequency rate is stored on a different storage capacitor, and that after $n$ new samples have been stored, the storage capacitors are all connected in parallel to produce the average of all stored samples.

It is a feature of second and third embodiments of this invention that the summation of $n$ samples generated at the higher frequency is achieved through the accumulation of charge on a single storage capacitor.

BRIEF DESCRIPTION OF THE DRAWING

The aformentioned and other objects and features of the invention are best understood by reference to the drawing in which.

DETAILED DESCRIPTION

Figure 1:
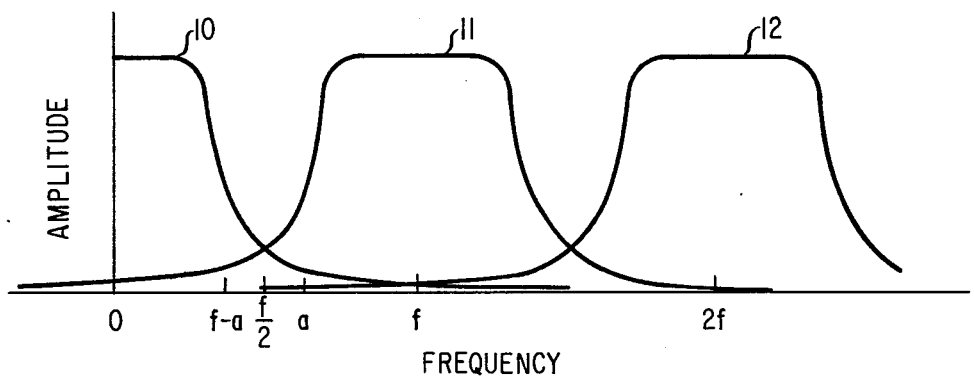
FIG. 1 is a frequency response curve useful in illustrating the source of aliasing distortion.

The frequency spectrum diagram of FIG. 1 is useful in illustrating the aliasing distortion problem. Spectrum 10 is the assumed frequency spectrum of an information signal. It will be assumed that the highest frequency of interest does not exceed $f/2$ although the information signal includes components at substantially higher frequencies. Should this information signal now be sampled at the frequency $f$, the original spectrum 10 of the information signal will be duplicated at every harmonic of the sampling frequency. Only the replicas at the first two harmonics 11 and 12, respectively) are shown in FIG. 1. It should be noted that the lower tail of the first sideband 11 extends completely into the original spectrum 10 which is the baseband of the spectrum of the sampled signal. This tail enhances the energy in the baseband and represents an undersirable distortion. Thus the frequency $a$ in baseband 10 results in the component at $f$-$a$ in sideband 11; and when it is attempted to recover the baseband signal, subsequently, the frequency $f$-$a$ will appear to have more energy than is actually present. Although filtering, particularly lowpass filtering, would be effective to remove the upper sidebands at the receiver, the aliasing distortion cannot be removed once sampling has taken place because it occurs in a wanted frequency band. It is, therefore, apparent that the spectrum 10 must be shaped prior to sampling at the rate $f$ in order to reduce the frequency components above $f/2$ to some acceptable level.

In accordance with the present invention, such shaping is provided by combining a plurality of sequential samples taken at a multiple of the frequency $f$. In particular, the method of the invention includes the following steps:
1. Sampling the information signal at a rate correspondent to an integer multiple $n$ of the highest frequency $f$, and 2. Each time $n$ new samples have been produced, combining these samples to produce a composite sample.
The sequence of composite samples is then used in place of the sample sequence normally produced by a sample-and-hold gate. In step 1, when sampling is performed at the rate $nf$, the aliasing distortion introduced is negligible because the first upper sideband occurs about the frequency $nf$ which is remote from the baseband and the effect of this sideband's tail on the baseband is grossly attenuated. The combination of $n$ equally spaced samples is equivalent to adding $n$ different phases of the received signal and tends to introduce frequency shaping, periodic with the frequency $nf$, to the information signal.

Figure 2:
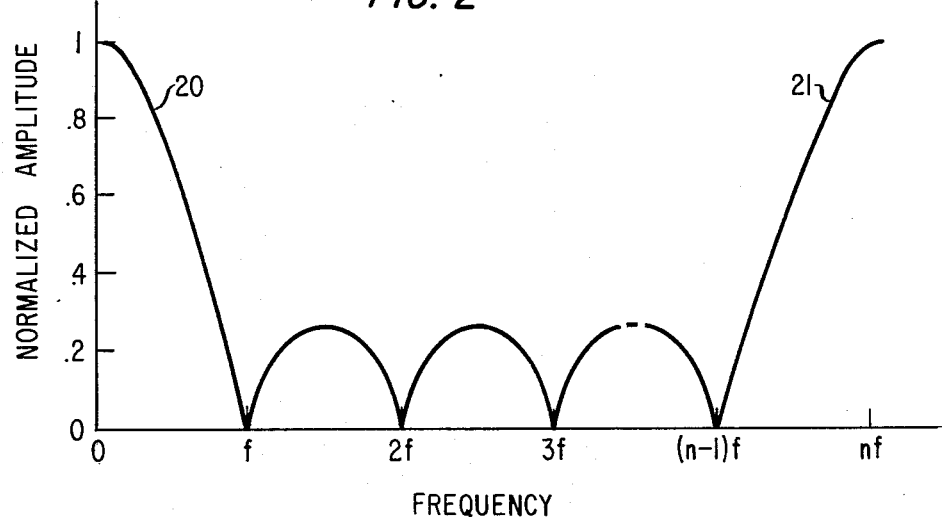
FIG. 2 illustrates the frequency response shaping introduced by the invention.

One cycle of the frequency-shaping characteristic is illustrated in FIG. 2. This has been normalized in amplitude with respect to the maximum transmission which occurs at DC and at multiples of $nf$ (only the zero and unity multiples being shown in FIG. 2). It should be noted that substantial attenuation is provided between the large lobes (e.g., 20 and 21) appearing at multiples of the frequency $nf$, and that at all multiples of the frequency $f$ which are not multiples of $nf$, an absolute null occurs. The large lobe 20, at DC effects lowpass filtering. The lobe at $nf$, 21, presents no problem because the information signal contains no appreciable energy at that high a frequency. Furthermore, any contributions due to the lobe at $nf$ are easily removed at any time through the use of a simple lowpass filter.

Effectively, the combination of the samples occurs prior to the production of the sum pulses at the frequency $f$. Therefore, the shaping is actually introduced to the continuous wave signal prior to the effective sampling time of the output signal. Thus, for all intents and purposes it appears as if a shaped signal is being sampled. Consequently, this periodic shaping is introduced not only to the baseband 10 of FIG. 1, but also to sidebands 11 and 12 and every other sideband of the spectrum of the sampled signal. As a result, the lower tail of sideband 11 is attenuated by the first lobe (e.g., 20) of its corresponding shaping function, and the aliasing distortion it introduces into baseband 10 is reduced.

Figure 3:
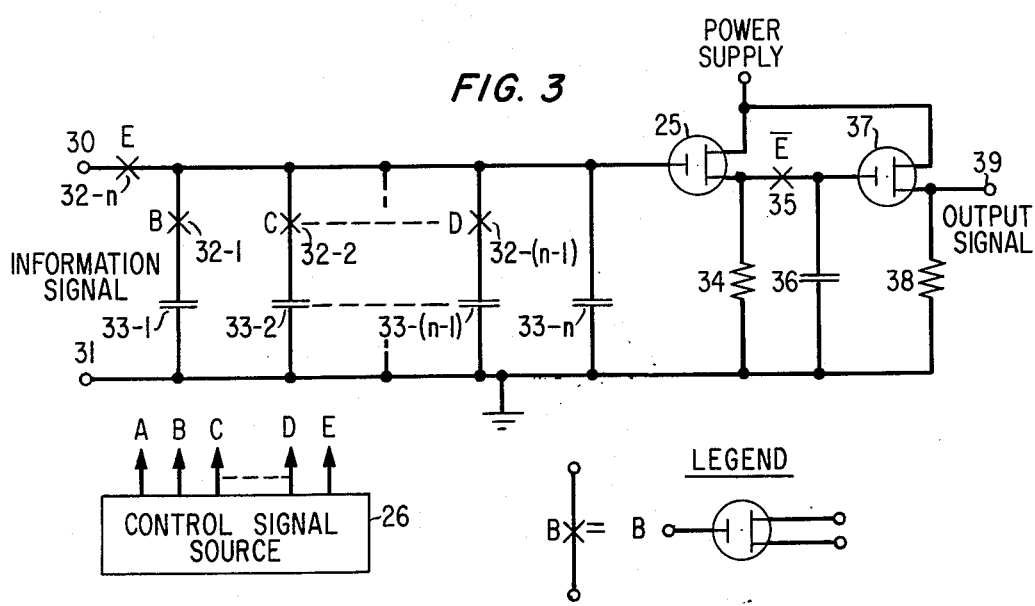
FIG. 3 is a schematic diagram of an embodiment of the invention which averages samples.

FIG. 3 is a schematic diagram of an embodiment of the invention in which each of the samples taken at the frequency $nf$ is stored in a different storage capacitor and the capacitors are all connected together at the frequency $f$ to produce a composite sample having an amplitude equal to the average of $n$ samples. The timing diagram of FIG. 4 is useful in explaining the operation of the embodiment of FIG. 3.

Figure 4:
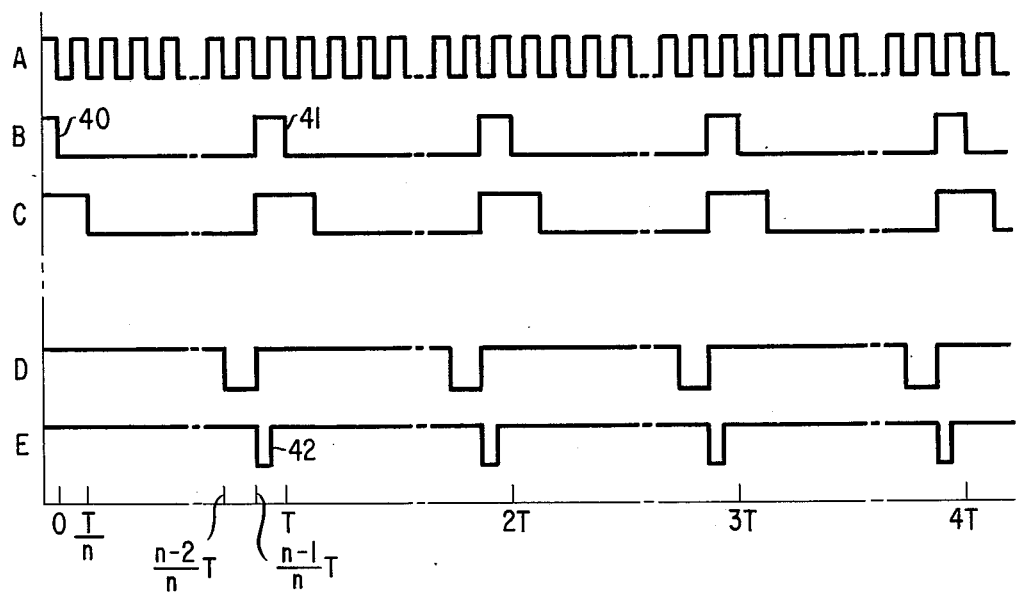
FIG. 4 is a timing diagram useful in explaining the operation of the embodiment of FIG. 3.

In FIG. 4 the individual waveforms are identified by letter designations. The same letters (except A) appear next to normally open switches in FIG. 3. This is intended to indicate that the high level in the correspondingly designated waveform will effect closure of the corresponding switch.

The waveforms of FIG. 4 are produced by control signal source 26, which is comprised of well-known logic elements. For example, the waveform A is readily generated by any conventional squarewave oscillator of frequency $nf$. Waveform E is then conveniently produced by counting negative-going pulses in waveform A with a counter having a maximum count of $n$ and decoding this maximum count. The negative-going transitions of waveform E are used to trigger one-shot multivibrators of appropriate duration to produce the remaining waveforms.

It will be noted that in FIG. 3 pluralities of components (e.g., switches 32-1 through 32-$n$) bear similar numerical designations, but have been assigned different numerical suffixes following a hyphen to permit identification of individual components. Hereafter, when reference is made to an entire group of such elements, only the common prefix (e.g., switches 32) will be used. When reference is made to an individual component, the entire designation (e.g., switch 32-1) will be used.

In operation, a continuous wave information signal to be sampled is applied between terminals 30 and 31. It is assumed that, initially, all of switches 32 are closed by virtue of their controlling waveforms being in the high state. Consequently, the information signal is applied to each of capacitors 33 through switch 32-$n$ and one other of switches 32. If switches 32 have low ON impedances, the voltage across capacitors 33 will essentially be equal to the information signal. At time 0 waveform B in FIG. 4 experiences a negative-going transition, 40. This has the effect of opening switch 32-1, thereby capturing charge on capacitor 33-1. The voltage stored on capacitor 33-1 is equal to the amplitude of the information signal at the instant that transistion 40 occurred (i.e., a sample taken at time 0 ). Similarly, switches 32-2 through 32-($n$-1) are each opened in sequence to store samples of the information signal at instants corresponding to multiples of $T/n$, where $T = 1/f$. Finally, at instant $n-1/n$ T switch 32-$n$ is opened by virtue of waveform E experiencing a negative transition (42); and the $n$th sample is stored on capacitor 33-$n$. Simultaneously, all other signals controlling switches experience a positive transition. As a result, switches 32-1 through 32-($n$-1) are all closed once more. Thus, all of capacitors 33 are connected in parallel and isolated from the information signal. The charge stored on various ones of capacitors 33 is redistributed among them in such a way as to produce the average of all stored samples across shunted capacitors 33.

Although according to the legend of FIG. 3, switches 32 and switch 35 are field effect transistors operated in the well-known transmission gate mode, any kind of controllable switch will serve the same purpose equally well. Capacitors 33 all are equal valued and should be large enough to prevent any significant error in stored voltages due to leak-off of charge. In the present embodiment capacitors in the order of several picofarads, which are readily integrated on the same chip as switches 32, adequately serve this purpose.

Field effect transistor 25 is operated in the well-known source-follower mode with resistor 34 as a source bias resistor. This requires that its drain be returned to the power supply as indicated. Transistor 25 merely serves as a buffer amplifier to provide isolation of capacitors 33 and thereby prevents leak-off of their charge. This transistor also presents a relatively low impedance at its source.

Switch 35 is controlled by the complement of waveform E (indicated as $\overline{E}$) which is generated by passing waveform E through an inverter (not shown). Switch 35 is therefore closed upon the occurrence of the negative transition in waveform E and is once again opened on the occurrence of the positive transition. Thus switch 35 is closed at instant $n\text{-}1/n\,T$ when capacitor 33 are all connected in parallel. As a result, capacitor 36 is charged through the low impedance of the source of transistor 25 to the average of all prior samples stored on capacitors 33. When waveform E experiences its positive transition, switch 35 opens and this charge is captured on capacitor 36. It can therefore be seen that switch 35 and capacitor 36 cooperate to perform a sample-and-hold function, at the frequency $f$, of the composite samples.

Field effect transistor 37 and resistor 38 cooperate to comprise a source-follower which presents a high impedance to capacitor 36 to prevent its discharge and also presents a low impedance node 39 is a sequence of samples at the frequency $f$ and held for a full cycle-length interval T. The amplitude of each of these samples is equal to the average of the prior samples taken at the frequency $nf$.

Observation of the waveforms B, C, D and E beginning with pulse 41 verifies that the waveforms are periodic with T (i.e., that the above process will repeat with frequency $f$.).

Figure 5:
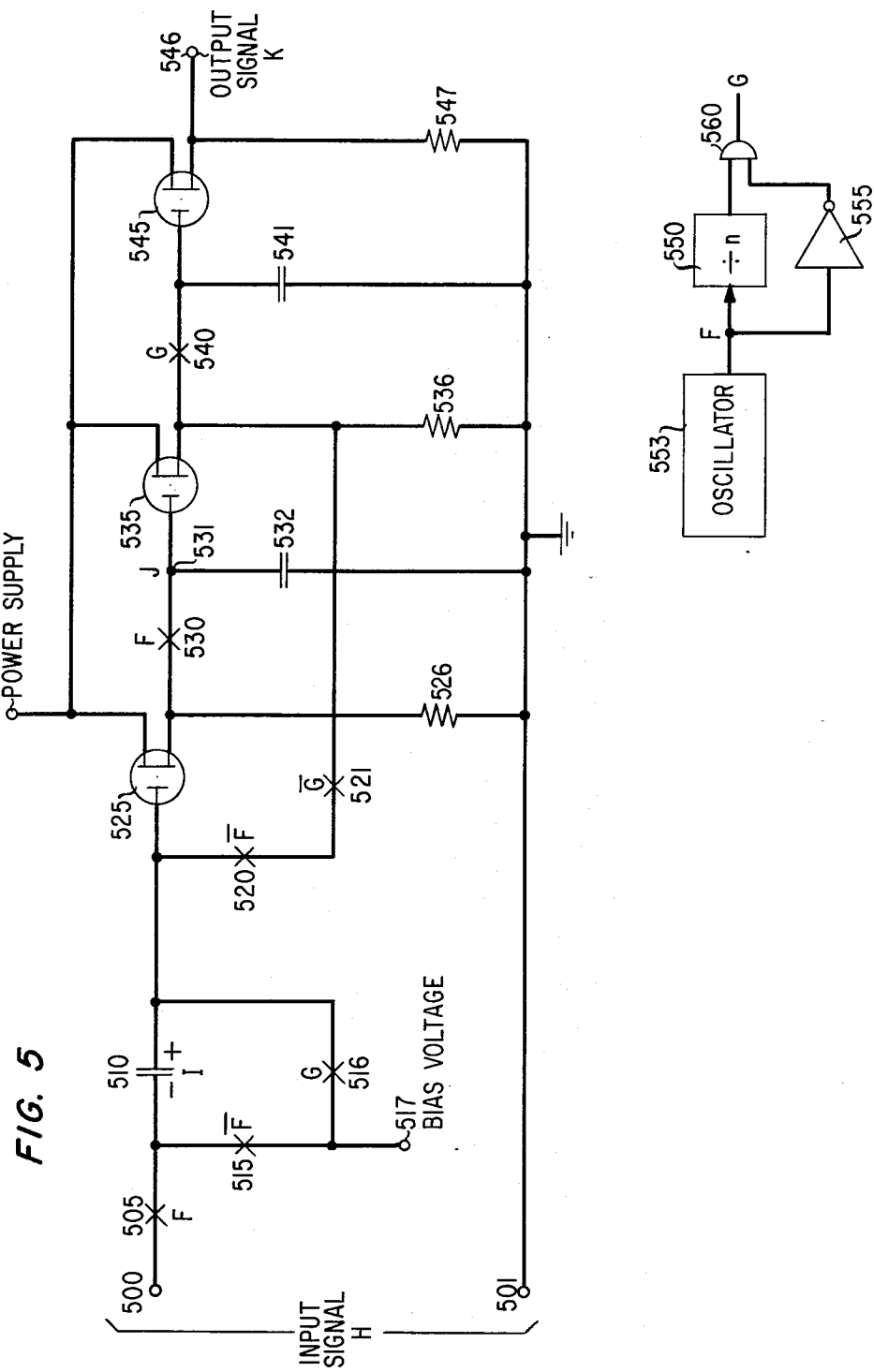
FIG. 5 is a schematic diagram of an embodiment which accumulates samples.
Figure 6:
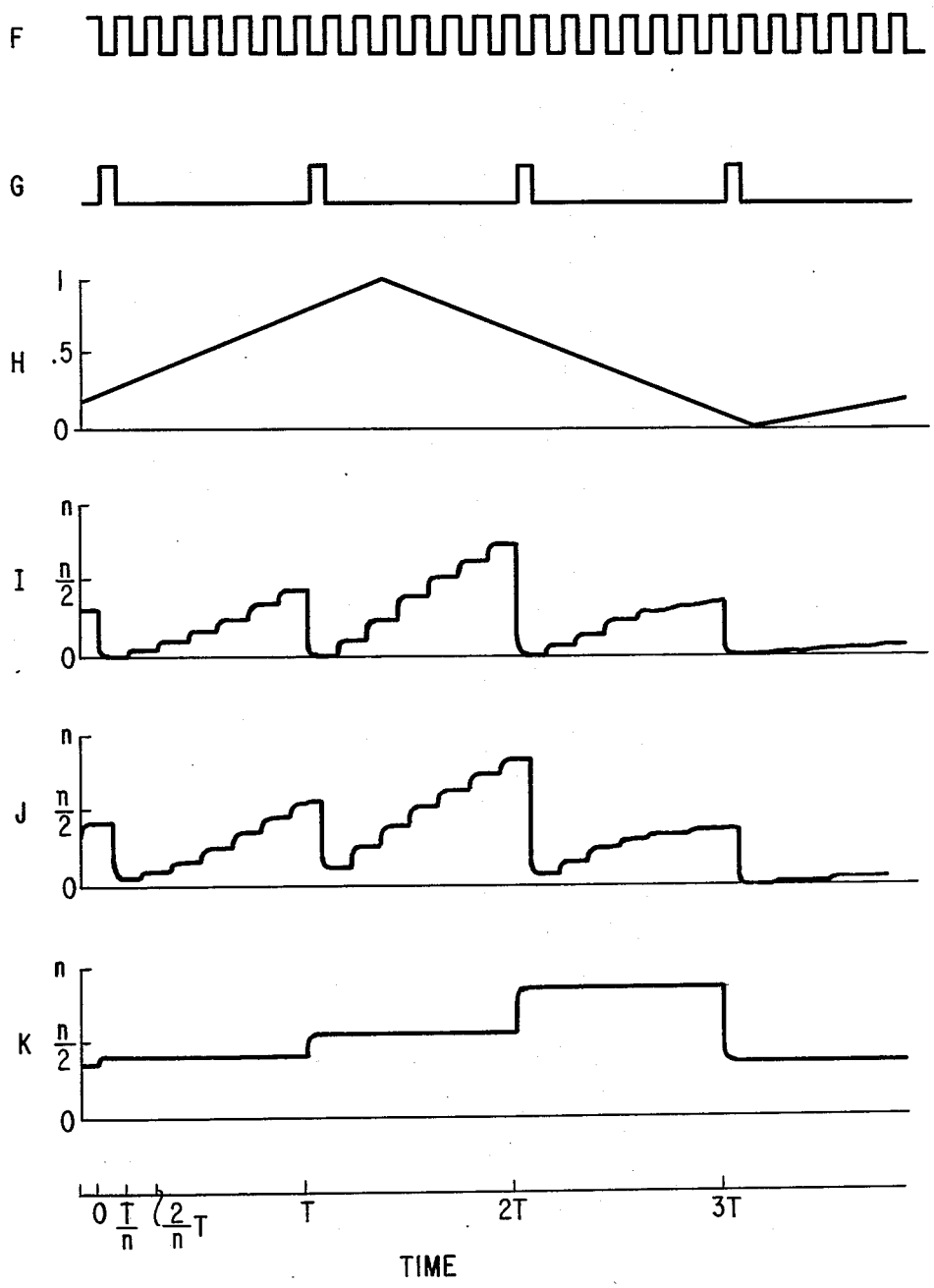
FIG. 6 is a timing diagram useful in explaining the operation of the embodiment of FIG. 5.

FIG. 5 is a schematic diagram of an embodiment of the invention in which a composite sample is produced by successively accumulating on a single storage capacitor charge corresponding to samples taken at the frequency $nf$. The waveform diagrams of FIG. 6, drawn on a common time scale, are useful in explaining the operation of the embodiment of FIG. 5. The waveforms of FIG. 6 are each identified by a unique letter designation. Where these letters appear on the diagram of FIG. 5, it is assumed that the corresponding waveform appears at that point in the circuit. Waveforms F and G are binary-control signals used to control switches. Where these appear next to a switch, it is assumed that the high level of the indicated waveform will effect closure of that switch. It should be noted that waveforms H through K are analog waveforms having a continuation of values.

The control waveforms, F and G, of FIG. 6 are readily generated by conventional means. For example, waveform F is conveniently generated by any conventional squarewave oscillator, 553 of frequency $nf$. The waveform F is then applied to divide-by-$n$ counter 550 and inverter 555. The divide-by-$n$ counter 550 is any form of dividing network that will produce a true output on every $n$th cycle of waveform F. Inverter 555 is any conventional inverter which produces the complement of the waveform F. The outputs of counter 550 and inverter 555 are applied to AND gate 560. This AND gate produces a high output on every $n$th cycle of waveform F when that waveform goes LOW, yielding waveform g.

From observation of FIG. 6, it can be seen that operation of the apparatus of FIg. 5 is periodic with period $T = 1/f$, $f$ being the rate at which composite samples are produced. A typical cycle of operation of the circuit of FIG. 5 begins at time 0. At this time high values of the waveforms $\overline{F}$ and G effect the closure of switches 515 and 516, respectively. This places a short circuit across capacitor 510 and discharges it as indicated by the waveform I going to 0 at time 0.

A continuous wave input signal (waveform H) is applied between terminals 500 and 501. When the waveform F goes high immediately following time 0, switch 505 is closed and the input signal is applied to the gate of field effect transistor 525 through switch 505 and capacitor 510.

Transistor 525 and resistor 526 are the well-known source-follower configuration and effectively serve as a buffer amplifier for the signal appearing at the gate of transstor 525. Inasmuch as the waveform F is in the hgih state, switch 530 is closed and the signal provided by the buffer amplifier comprising transistor 525 and resistor 526 charges capacitor 532. Thus, waveform J appearing at node 531 assumes the values of the input signal.

When the waveform F goes low, switches 505 and 530 are opened trapping charge on capacitor 532. Capacitor 532 therefore stores a sample of the input signal at the instant that waveform F goes low. In addition, when waveform F goes low, switch 520 is closed and switch 521 is also closed because of the low condition of waveform G. There is no short across capacitor 510 because waveform G is low. Consequently, capacitor 510 is charged to the voltage across capacitor 532 through the buffer amplifier comprising transistor 535 and 536 and through the charging path including switches 521, 520, capacitor 510, switch 515, node 517, and a bias voltage source. Thus the waveform I, appearing across capacitor 510 with polarity as indicated, assumes the value of the voltage stored on capacitor 532.

The bias voltage applied to node 517 is equal to the quiescent voltage of the source of transistors 535. This cancels the threshold voltages of transistors 525 and 535 and guarantees that the voltage stored on capacitor 510 will be equal to the sampled value of the input signal.

When waveform F once again goes high, switch 520 opens and the charge is trapped on capacitor 510 due to the high impedance of the gate of transistor 525. Thus, capacitor 510 also stores the sample of the input signal. At the same time, switches 505 and 530 once again close and the sample stores on capacitor 510 is placed in series with the input signal. Consequently, capacitor 532 is charged to a voltage equal to the present value of the input signal plus the prior sample as indicated by waveform J. When waveform F once more goes low at time $2t/n$, a voltage is stored on capacitor 510 equal to the sume of the two samples thus far taken.

By extension of the above procedure it can be seen that capacitor 532 is charged to the cumulative summation of samples of the input signal. Thus, just prior to time T, capacitor 532 has been charged to a voltage equal to the sum of all $n$ samples which have ben taken since time 0. At time T, the waveform F goes low opening up switches 505 and 530 which prevents charging of capacitor 532. In addition, the low state of the waveform F closes 515 and 520. At the same time, waveform G goes high, closing switch 516 and opening switch 521. The opening of switch 521 keeps open the charging path for capacitor 510 from transistor 535, and inasmuch as switch 515 is closed, the closure of switch 516 places a short across capacitor 510 to effect its discharge and initiate another cycle of operation.

A further consequence of the waveform G going high at time T is the closure of switch 540 which effects charging of capacitor 541 to the voltage stored on capacitor 532 through the buffer amplifier comprising transistor 535 and resistor 536 and through switch 540. When the waveform G goes low subsequent to time T, the charge is trapped on capacitor 541 and this capacitor stores a voltage equal to the voltage which was held on capacitor 532. Owing to the high impedance of the gate of transistor 545 the voltage stored on capacitor 541 is held there when switch 540 opens up (i.e., it is held until the next time waveform G goes high). Thus switch 540 and 541 comprise a sample-and-hold gate.

Field effect transistor 545 and resistor 547 comprise a source-follower which is a buffer amplifier for the signal appearing on capacitor 541. As indicated by waveform K, the output signal has a response resembling that of a sample-and-hold gate operating at the frequency $f$.

It should be noted that the input signal (waveform H) has been shown normalized with respect to its maximum amplitude. Waveforms I, J and K exhibit substantially larger amplitudes because they result from the addition of samples of waveform H. However in the drawing, they are scaled down by a factor of $1/n$ for convenience of illustration. Inasmuch as $n$ samples of waveform H are added and their maximum value is 1, waveforms I, J and K can assume a maximum amplitude as large as $n$. Clearly, since waveform K represents a sum of $n$ samples, the average value of these samples could be obtained by dividing waveform K by $n$. It should therefore be apparent that the embodiment of FIG. 5 exhibits a gain of $n$ with respect to the embodiment of FIG. 3 which produces the average of $n$ samples.

Figure 7:
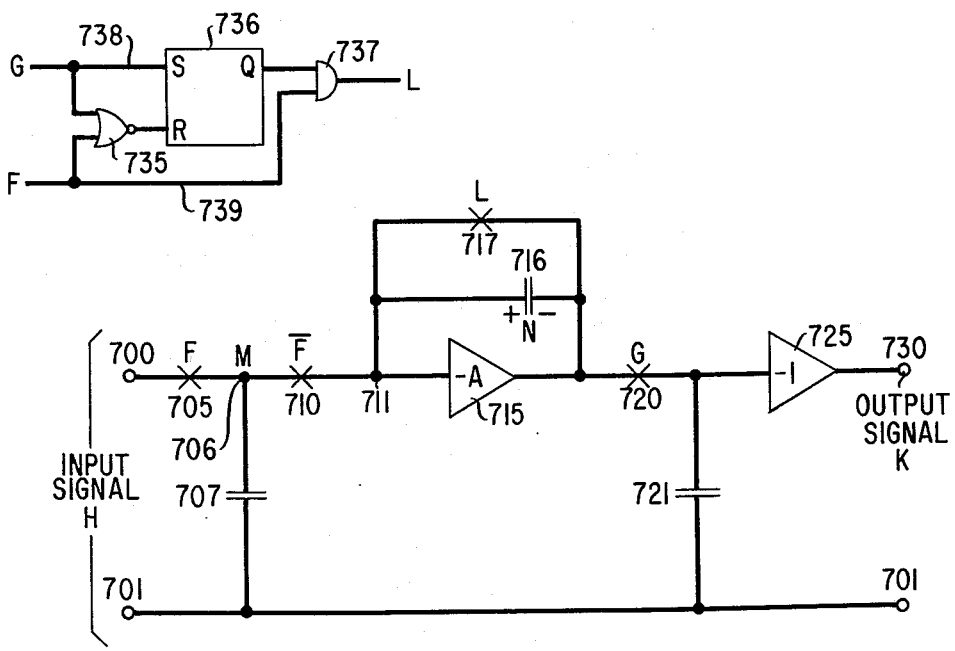
FIG. 7 is a schematic diagram of another embodiment which accumulates samples.
Figure 8:
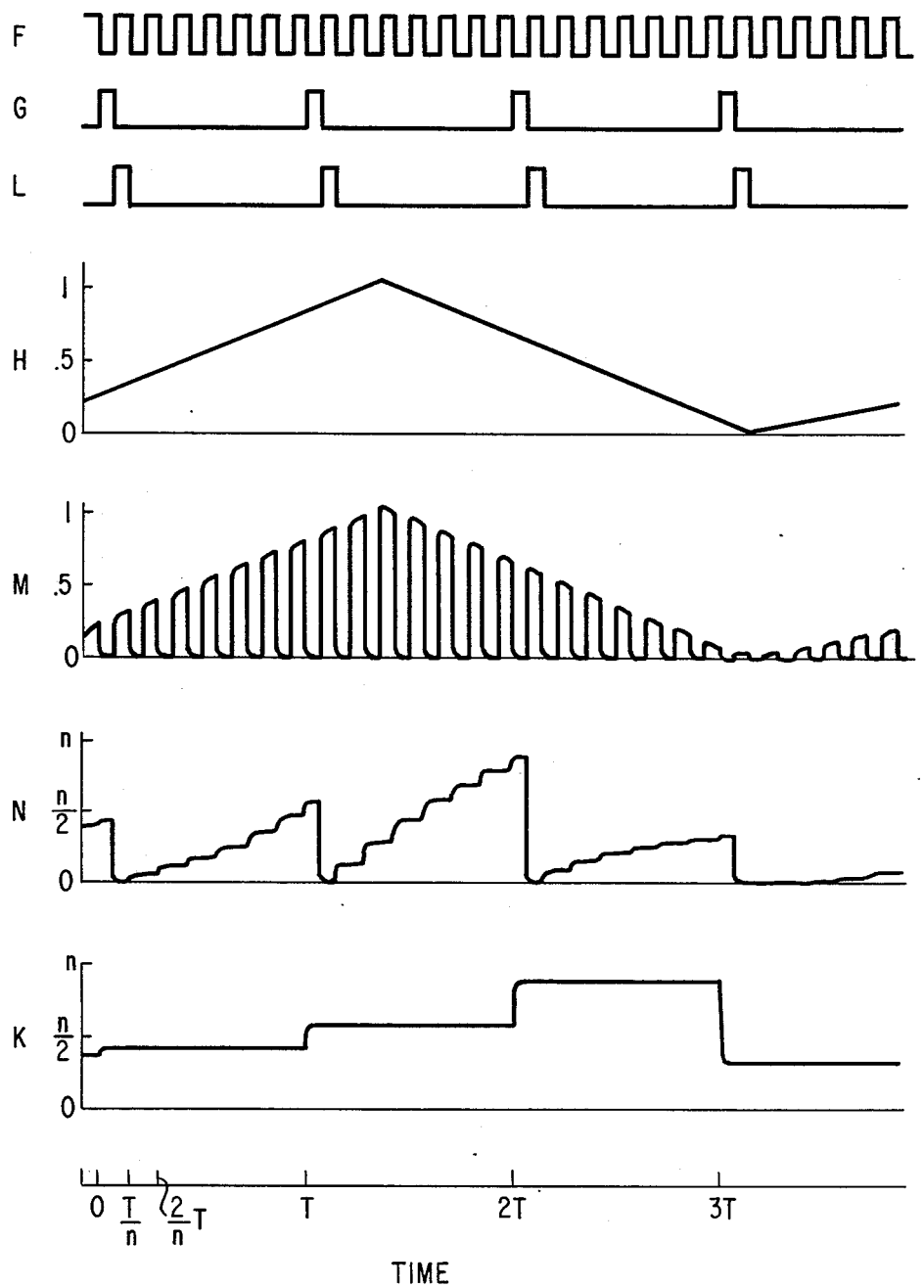
FIG. 8 is a timing diagram useful in explaining the operation of the embodiment of FIG. 7.

FIG. 7 is a schematic diagram of another embodiment of the invention which employs cumulative charging of a storage capacitor. FIG. 7 will be discussed in conjunction with FIG. 8 which presents the timing diagram for the embodiment of FIG. 7. In compliance with the previously established convention herein the waveforms of FIG. 8 are designated by letters, and the appearance of the same letters in FIG. 7 indicates that the corresponding waveform appears at that point in FIG. 7, or in the case of a switch is used to control the closure of the switch next to which the letter appears. It should be noted that the signals F, G and H applied to the circuit of FIG. 7 are identical to the correspondingly designated signals applied to the circuit of FIG. 5.

The control waveforms F, G and L of FIG. 8 are readily produced by conventional means. For example, waveforms F and G are generated in the same manner as the correspondingly designated waveform in FIG. 5. The waveform G is provided to the set input of a set-reset flip-flop, 736, of any conventional type. When a pulse occurs in waveform G, setting the flip-flop, to Q output goes high, enabling AND gate 737. Thus, the next pulse produced in waveform F, which is coupled to AND gate 737 via lead 739, is permitted to pass through the AND gate and produces a pulse in waveform L. NOR gate 735 produces a high output only when both inputs are low. When the pulse occurs in the waveform L, the waveform G is already low. Since the trailing edge of the pulse in waveform L corresponds to the trailing edge of the pulse in waveform F, the output of NOR gate 735 goes high as soon as the pulse in L disappears. As a result, flip-flop 736 is reset causing its Q output to go low, thereby disabling AND gate 35 from passing any more pulses of waveform F. In this manner the sequence of pulses at the frequency $f$ is produced in waveform L.

A continuous wave input signal (waveform H) is applied between nodes 700 and 701. The pulses appearing in waveform F at the frequency $nf$ permit repetitive closure of switch 705 to charge capacitor 707 to the value of the input signal. When the signal F goes low, switch 705 opens, trapping the charge on capacitor 707 (and storing a sample of waveform H) and switch 710 closes to connect capacitor 707 to node 711.

The effect of inverting voltage amplifier 715 also connected to node 711 is to multiply the value of its shunt capacitor, 716. That is, it appears as if there is connected nodes 711 and 701 an effective capacitor which is $(A + 1)$ times as large as capacitor 716 where $-A$ is the gain of amplifier 715. If A is large and capacitor 707 and 716 are of the same value, this effective capacitor will be much larger than capacitor 707.

When signal F goes low closing switch 710, the effective capacitor appears in parallel with capacitor 707 and charge is redistributed between them. When A is large, negligible charge is given up by the effective capacitor and almost all of the charge of capacitor 707 is given up. Thus it is seen by reference to FIG. 8 that when the waveform F goes high, capacitor 707 (waveform M) is charged to the value of the input signal (waveform H). When waveform F goes low, the input signal is disconnected and the closure of switch 710 causes capacitor 707 to give up essentially all of its charge to the effective capacitor. This is surmised from the fact that the voltage across capacitor 707 (waveform M) goes to zero, and the voltage across capacitor 716 (waveform N) increases.

Through the process just described, successive samples of the input signal are trapped on capacitor 707 and used to accumulate charge on capacitor 716. After $n$ of such samples have been accumulated, the waveform G goes high. Like switch 540 and capacitor 541 of FIG. 5, switch 720 and capacitor 721 comprise a sample-and-hold gate operating at the frequency $f$. Thus the waveform G effects periodic sampling and holding of the wavefomr N at the frequency $f$. Inverting buffer amplifier 725, of any conventional form, isolates capacitor 721 from output node 730 to prevent discharge of the capacitor. The output signal (waveform K) has the familiar form of the sample-and-hold signal at the frequency $f$.

It should be noted that in the above description it was assumed that the gain A of amplifier 715 was large enough to cause complete discharge of capacitor 707. Should this gain not be large enough, there will be a true charge redistribution between capacitors 707 and 716, and the over-all effect would be that the resulting waveform N would be attenuated with respect to the waveform N indicated in FIG. 8. This in no way affects the filtering properties of the apparatus, but merely reduces the gain of the apparatus below the value $n$ indicated in FIG. 8.

Although specific embodiments of this invention have been shown and described for illustrative purposes, it will be understood that various modifications may be made without departing from the spirit and scope of the principle of the invention.

What is claimed is:

1. The method of generating, at rate $f$, pulse amplitude modulation (PAM) samples corresponding to a continuous wave signal and reducing aliasing distortion, said signal having a highest frequency of interest not exceeding $f/2$, comprising the steps of:

sampling said signal $nf$ times per second where $n$ is an integer greater than 1, and combining the $n$ most recently taken samples $f$ times per second to produce by each of such sample combinations one of the PAM samples.

2. The method of claim 1 in which said combining step comprises the steps of independently storing each new sample as it is taken and combining all of said samples upon taking the last one.

3. The method of claim 1 in which said combining step comprises the step of sequentially accumulating said samples.

4. In an apparatus for generating, at rate $f$, pulse amplitude modulation (PAM) samples corresponding to a continuous wave signal having a highest frequency of interest not exceeding $f/2$ said apparatus including a plurality of storage capacitors, the method of reducing aliasing distortion comprising the steps of:

sampling said signal $nf$ times per second where $n$ is an integer greater than 1, and combining the $n$ most recently taken samples $f$ times per second to produce by each of such sample combinations one of the PAM samples.

5. The method of claim 4 in which said combining step comprises the steps of:

storing each of $n$ samples on a different one of said capacitors, and momentarily connecting all of said capacitors in shunt $f$ times per second to produce a composite sample having an amplitude which is the average of the samples stored on said capacitors.

6. The method of claim 4 in which said combining step comprises the steps of:

discharging a first of said capacitors $f$ times per second, and performing the following sequence of steps $n$ times between successive discharging steps:

coupling one of said samples to a second of said capacitors through said first capacitor, thereby storing on said second capacitor a voltage equal to the sum of the voltage stored on said first capacitor and said sample, and storing on said first capacitor the voltage stored on said second capacitor;

the voltage appearing across said second capacitor just prior to a discharging step corresponding to a composite sample equal to the sum of all samples taken since the prior discharging step.

7. The method of claim 4 in which said combining step comprises the steps of:

discharging a first of said capacitors $f$ times per second, and performing the following sequence of steps $n$ times between successive discharging steps:

storing one of said samples on a second of said capacitors; and transferring at least part of the charge from said second capacitor to said first capacitor; the voltage appearing across said first capcitor just prior to a discharging step corresponding to a composite sample having an amplitude proportional to the sum of all samples taken since the prior discharging step.

8. The method of claim 4 further comprising the steps of sampling each of said composite samples just after it is produced and holding same until the next composite sample is produced.

9. In an apparatus for producing samples of continuous wave signal, said apparatus including first and second terminals for receiving said signal, the improvement comprising:

a source of a plurality of control signals, a third terminal, a first switch normally connecting said first and third terminals and responsive to a first one of said control signals to disconnect said terminals, at least one storage network connected between said second and third terminals, each storage network comprising a capacitor and a normally open switch, in series with said capacitor, operative to close in response to a second one of said control signals, and a storage capacitor connected between said second and third terminals.

10. The apparatus of claim 9 further comprising means for sampling and holding the signal appearing between said second and third terminals.

11. In an apparatus for producing $f$ samples per second of a continuous wave input signal having a highest frequency of interest not exceeding $f/2$, the improvement comprising:

means for taking $nf$ samples per second of said signal, where $n$ is an integer greater than 1, and means for adding $n$ sequential ones of said samples.

12. The apparatus of claim 11 further comprising means for sampling and holding the sum produced by said adding means $f$ times per second.

13. The apparatus of claim 11 in which said adding means comprises:

a plurality of capacitors, means, incorporating said sampling means, for storing each of $n$ sequential ones of said samples on a different one of said capacitors, and means, included in said storing means, for connecting all of said capacitors in shunt.

14. The apparatus of claim 11 in which said adding means comprises:

first and second storage means, means for providing to said first storage means the sum of the most recent one of said samples and the contents of said second storage means, means for applying to said second storage means the contents of said first storage means, and means for emptying said second storage means $f$ times per second.

15. The apparatus of claim 11 in which said adding means comprises:

a first capacitor for storing the most recent one of said samples, a second capacitor, means for transferring charge from said first to said second capacitor, and means for discharging said second capacitor afer $n$ new samples have been taken.

16. The apparatus of claim 15 in which said transferring means comprises:

means for connecting first ends of said first and second capacitors after each of said samples is taken, and an inverting amplifier having its input and output connected, respectively, to the first and second ends of said second capacitor.

* * * * *

UNITED STATES PATENT AND TRADEMARK OFFICE
CERTIFICATE OF CORRECTION

PATENT NO. : 4,039,979
DATED : August 2, 1977
INVENTOR(S) : Robert L. Carbrey

It is certified that error appears in the above-identified patent and that said Letters Patent are hereby corrected as shown below:

Column 1, line 48, "band re-jection" should read --band-- rejection--;
50, "handwidth" should read --bandwidth--.
2, 17, "integar" should read --integer--.
5, 35, after "impedance" insert --at--, after "39" insert a period and add --The output signal produced at low impedance node 39--.
6, 25, "transstor" should read --transistor--;
26, "hgih" should read --high--;
48, "transistors" should read --transistor--;
57, "stores" should read --stored--;
63, "sume" should read --sum--;
68, "ben" should read --been--.
7, 65, "to" should read --the--.
8, 24, after "connected" insert --between--;
52, "wavefomr" should read --waveform--.
9, 67, "capcitor" should read --capacitor--.

Signed and Sealed this

Twentieth Day of December 1977

[SEAL]

Attest:

RUTH C. MASON
Attesting Officer

LUTRELLE F. PARKER
Acting Commissioner of Patents and Trademarks